(12) United States Patent
Yoshida et al.

(10) Patent No.: US 7,238,076 B2
(45) Date of Patent: Jul. 3, 2007

(54) METHOD OF ASSEMBLING LIGHT-EMITTING APPARATUS

(75) Inventors: Hiroshi Yoshida, Kanagawa (JP); Tadashi Taniguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 233 days.

(21) Appl. No.: 10/514,179

(22) PCT Filed: Mar. 10, 2004

(86) PCT No.: PCT/JP2004/003120

§ 371 (c)(1),
(2), (4) Date: Nov. 10, 2004

(87) PCT Pub. No.: WO2004/107515

PCT Pub. Date: Dec. 9, 2004

(65) Prior Publication Data

US 2005/0153478 A1    Jul. 14, 2005

(30) Foreign Application Priority Data

Mar. 11, 2003    (JP)    ............................. 2003-064932

(51) Int. Cl.
*H01J 9/00*    (2006.01)

(52) U.S. Cl. ........................................................ 445/23
(58) Field of Classification Search .................. 445/23
See application file for complete search history.

(56) References Cited

U.S. PATENT DOCUMENTS

| 5,392,305 | A | 2/1995 | Jakobson |
| 6,093,576 | A | 7/2000 | Otani |
| 6,220,767 | B1 | 4/2001 | Bookbinder |
| 6,396,023 | B1 | 5/2002 | Aikiyo |
| 6,943,128 | B2 * | 9/2005 | Chiyo et al. ................. 438/795 |

FOREIGN PATENT DOCUMENTS

| EP | 655813 | 5/1995 | |
| JP | 401316945 A | * 12/1989 | ................. 257/781 |
| JP | 9-129976 | 5/1997 | |
| JP | 9-232461 | 9/1997 | |
| JP | 11-87814 | 3/1999 | |
| JP | 2000-133868 | 5/2000 | |
| JP | 2000-352730 | 12/2000 | |
| JP | 2003-298171 | 12/2000 | |
| JP | 2003-263774 | 9/2003 | |
| WO | WO 00/70425 | 11/2000 | |

\* cited by examiner

*Primary Examiner*—Joseph Williams
(74) *Attorney, Agent, or Firm*—Robert J. Depke; Rockey, Depke, Lyons & Kitzinger LLC.

(57) ABSTRACT

In an assembling method of a light emitting device having a light emitting element for emitting light and a package for sealing in at least the light emitting element, the package is sealed in an ozone atmosphere and the light having a wavelength is irradiated into the sealed package. Activated ozone produced in the package collides with an Si organic compound and the Si organic compound is decomposed and becomes a stable substance.

8 Claims, 13 Drawing Sheets

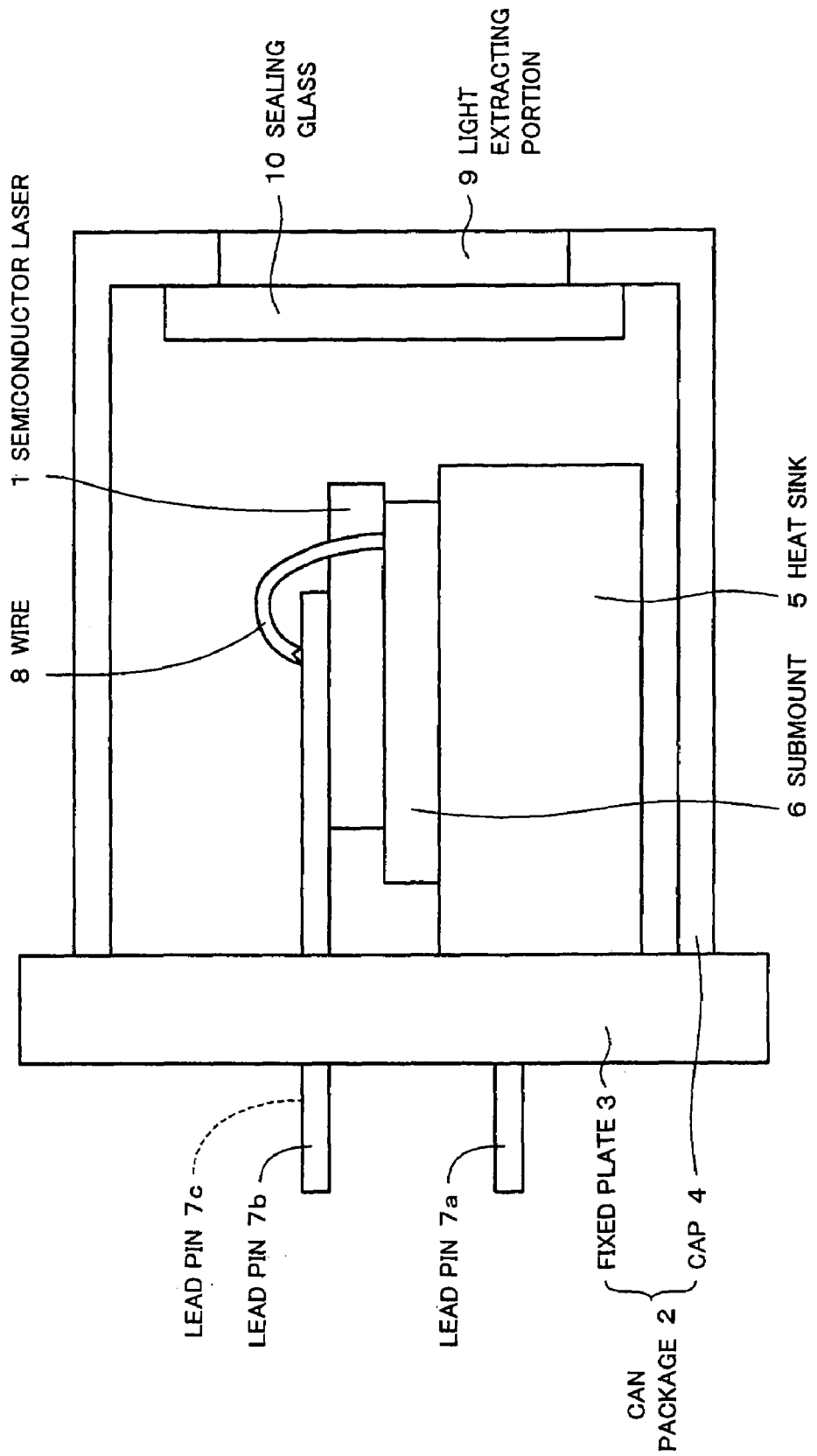

IN DRY OZONE ATMOSPHERE

XENON LAMP

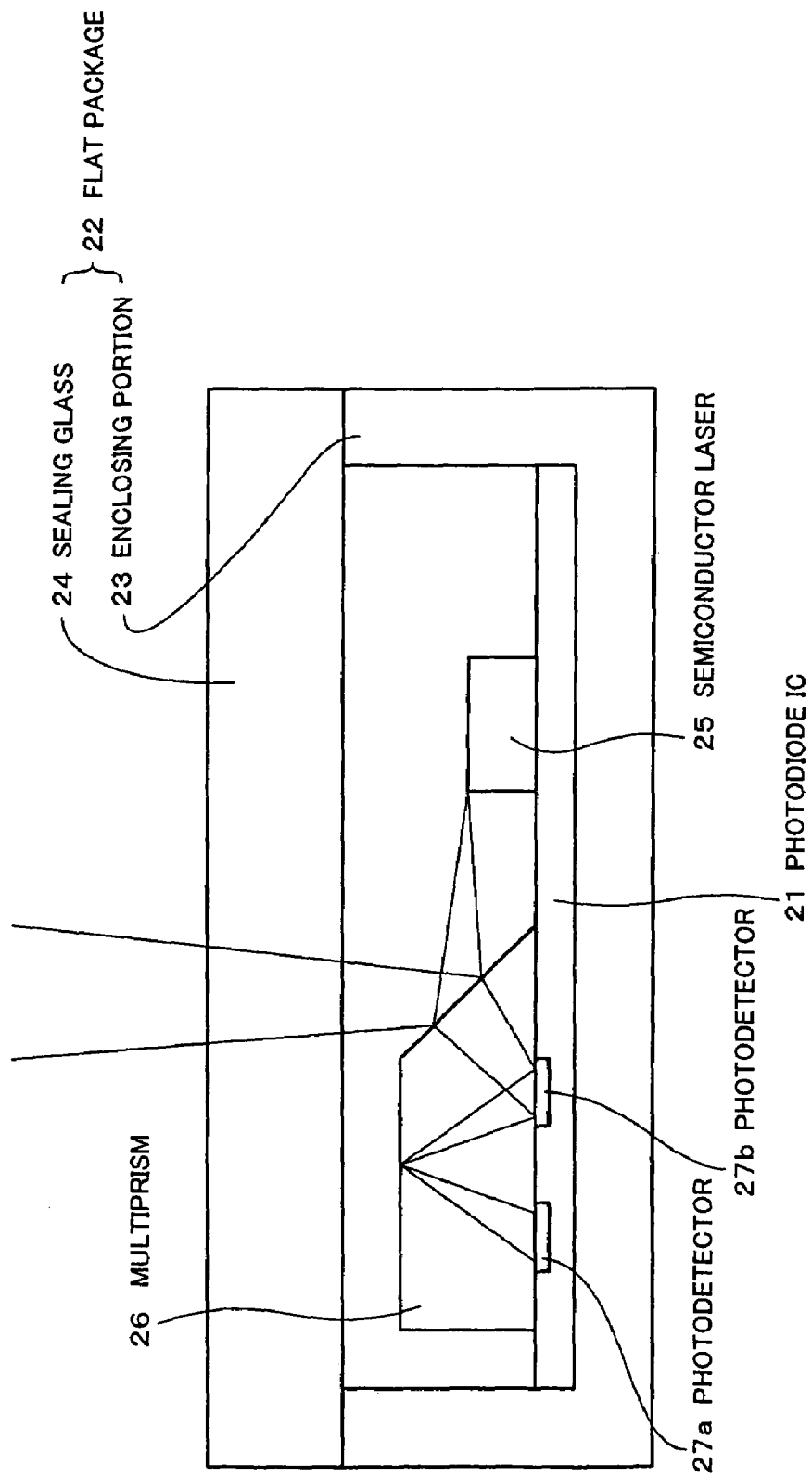

IN DRY OZONE ATMOSPHERE

XENON LAMP

IN DRY OXYGEN ATMOSPHERE

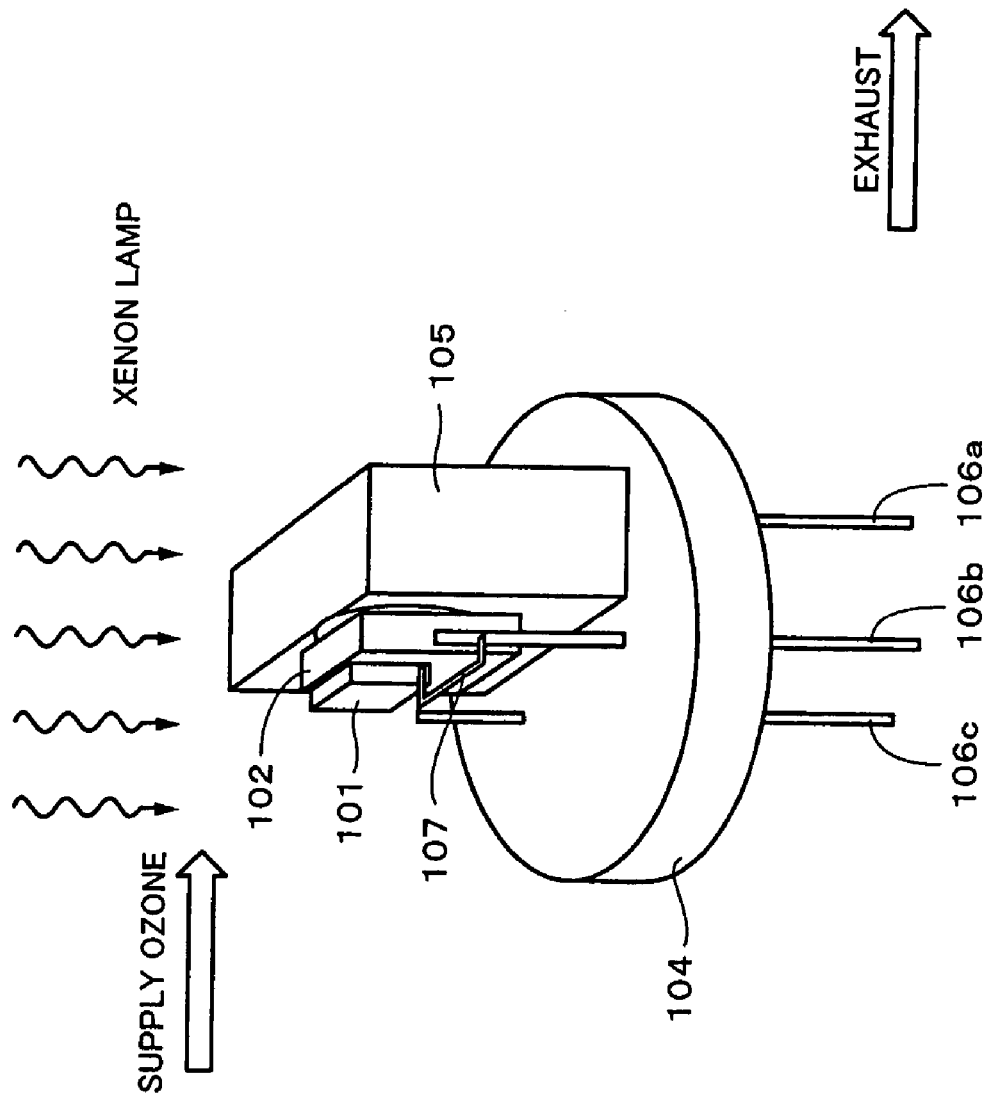

METHOD OF ASSEMBLING LIGHT-EMITTING APPARATUS

This application claims priority to Japanese Patent Application Number JP2003-064932, filed Mar. 11, 2003 which is incorporated herein by reference.

TECHNICAL FIELD

The invention relates to an assembling method of a light emitting device having a construction in which a light emitting element is enclosed by a package.

BACKGROUND ART

In recent years, semiconductor lasers have been used in various technical fields. For example, they are used as light sources in an optical disc recording/reproducing apparatus, a display apparatus such as a laser display or the like, a laser printer apparatus, and a light communicating apparatus.

Hitherto, semiconductor lasers of an AlGaAs system, AlGaInAs system, and AlGaInP system have already been commercialized as such semiconductor lasers. In recent years, it is demanded to commercialize a semiconductor laser of a GaN/GaInN system which can emit a laser beam of a further short wavelength. It has been proposed to use such a GaN/GaInN system semiconductor in an optical system for recording/reproducing, for example, a high density optical disc (Blu-ray Disc) of the next generation.

The semiconductor laser is generally enclosed in a package in order to prevent adhesion of impurities or the like and various kinds of packages are used. Among them, a CAN package is one of the most widely used packages.

An assembling method of the conventional CAN package light emitting device will now be described herein below with reference to FIGS. 10A, 10B, 11A, 11B, 12A, and 12B.

<Chip Mounting Step>

First, as shown in FIG. 1A, a semiconductor laser 101 such as AlGaAs system semiconductor laser of a band of 790 nm, AlGaInP system semiconductor laser of a band of 650 nm, or the like is adhered to a predetermined position on a submount 102 by a Sn solder.

<Die-Bonding Step>

Subsequently, as shown in FIG. 10B, the submount 102 is die-bonded to a predetermined position on a heat sink 105 provided for a fixed plate 104. In this instance, an Ag paste is used as an adhesive agent 103.

<Paste Hardening Step>

Subsequently, as shown in FIG. 11A, the adhesive agent 103 is hardened.

<Wire-bonding Step>

Subsequently, as shown in FIG. 11B, the submount 102 and a lead pin 106b are connected by an Au wire 107.

<Sealing Step>

Subsequently, as shown in FIG. 12A, a cap 108 is electrically welded to the fixed plate 104 in an oxygen (dry oxygen) atmosphere from which moisture ($H_2O$) has been removed. Thus, as shown in FIG. 12B, the CAN package light emitting device in which dry oxygen has been sealed is completed. In the sealing step, as a gas (substitute gas) which is sealed in the CAN package light emitting device besides dry oxygen, a $N_2$ (nitrogen) gas, an Ar (argon) gas, a He (helium) gas, or mixture gases consisting of $N_2$ and $O_2$ is generally used.

Although rarely disclosed because of a recognition as know-how, there is a deteriorating mechanism which is caused by reactive growth between gases which are generated from installed parts and their materials. Besides electric energy, heat energy and light energy can be mentioned as energy sources. It has been known that a method of properly selecting the substitute gas is effective as a countermeasure for such a deteriorating mechanism.

According to the knowledge of the inventors of the present invention, if the CAN package light emitting device having the GaN/GaInN system semiconductor laser of the 405 nm band is manufactured by the assembling method mentioned above, there is such a problem that in such a light emitting device, a deposit is formed in a light emitting portion of the semiconductor laser 101 and a drive current fluctuates periodically in accordance with a driving time.

Therefore, the inventors of the present invention have examined in order to investigate the causes of the creation of such a deposit, so that they obtained the following knowledge.

(1) The deposit is formed only in the light emitting portion when the semiconductor laser 101 is driven. Therefore, the creation of the deposit is a reaction concerned with light.

(2) The Ag paste is not directly come into contact with the semiconductor laser 101. Further, no Ag is contained in the deposit. Therefore, the creation of the deposit is not caused by such a phenomenon that the Ag paste is diffused into the semiconductor laser 101.

The inventors of the present invention have made a further examination on the basis of the above knowledge, so that they found out that an Si organic compound gas which is generated from the Ag paste and an Si organic compound gas adhered to the fixed plate 104 reach the light emitting portion of the semiconductor laser 101 and react on an emitted laser beam, so that the deposit is formed.

Therefore, to prevent the deposit from being formed in the light emitting portion of the semiconductor laser 101, in the assembling method of the conventional CAN package light emitting device, the applicant of the present invention proposes an assembling method of a light emitting device whereby an ozone cleaning step is provided between the wire bonding step and the sealing step.

FIG. 13 shows the ozone cleaning step proposed by the applicant of the present invention. In the ozone cleaning step, as shown in FIG. 13, while supplying an ozone ($O_3$) gas, ultraviolet rays are irradiated to the fixed plate 104 by a xenon lamp. Thus, activated ozone collides with a surface of the Ag paste and a surface of the fixed plate 104 and an Si organic compound is decomposed. An Si element is converted into $SiO_2$ and becomes a stable substance. A hydrocarbon portion of an alkyl group or the like is decomposed to CO, $CO_2$, or $H_2O$.

However, according to the above assembling method, such a problem that parts of the fixed plate 104, the semiconductor laser 101, and the like are polluted again by the Si organic compound gas before sealing occurs. Such recontamination is particularly conspicuous in the case where the step using the Ag paste exists on the processes from the cleaning step to the sealing step or in the case where a staying period of time from the completion of the cleaning to the sealing is long.

As a method of avoiding the recontamination, there are considered (1) a method of promptly sealing after the ozone cleaning and (2) a method of realizing such an environment that no Si organic compound gas is adhered onto the fixed plate or the like before sealing. However, if such time-dependent and environmental limitations are provided in the steps, such a problem that mass-productivity deteriorates is caused.

DISCLOSURE OF INVENTION

It is an object of the invention to provide an assembling method of a light emitting device having a light emitting element for emitting light and a package for enclosing at least the light emitting element, wherein it is possible to prevent a deposit from being formed in a light emitting portion of the light emitting element without causing deterioration of mass-productivity.

To accomplish the above object, according to the invention, there is provided an assembling method of a light emitting device having a light emitting element for emitting light and a package for enclosing at least the light emitting element, wherein the package is sealed in an ozone atmosphere and light having a wavelength of 400 nm or less is irradiated into the sealed package.

According to the invention, in the assembling method of the light emitting device having the light emitting element for emitting the light and the package for enclosing at least the light emitting element, since the package is sealed in the ozone atmosphere and the light having the wavelength of 400 nm or less is irradiated into the sealed package, vaporization of the Si organic compound existing in the package can be prevented without providing the time-dependent and environmental limitations in the steps.

BRIEF DESCRIPTION OF DRAWINGS

FIG. 1 is a cross sectional view showing an example of a construction of a CAN package light emitting device according to the first embodiment of the invention.

FIG. 7 is a cross sectional view for explaining a construction of a flat package light emitting device according to the second embodiment of the invention.

FIG. 13 is a schematic diagram for explaining an ozone cleaning step in the assembling method of the conventional CAN package light emitting device.

BEST MODE FOR CARRYING OUT THE INVENTION

Figure 2A:
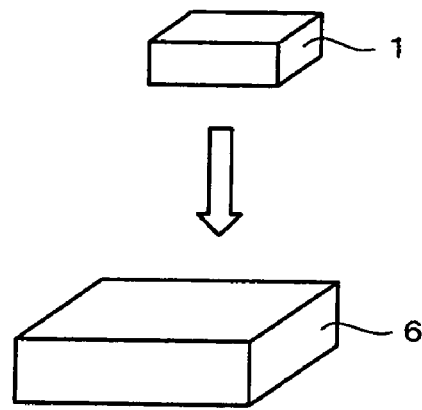
FIGS. 2A and 2B are schematic diagrams showing an example of an assembling method of the CAN package light emitting device according to the first embodiment of the invention.

Embodiments of the invention will be described hereinbelow with reference to the drawings. FIG. 1 shows an example of a construction of a CAN package light emitting device according to the first embodiment of the invention. As shown in FIG. 1, this light emitting device comprises a semiconductor laser 1 and a CAN package 2 for enclosing the semiconductor laser 1. The CAN package 2 comprises: a fixed plate 3 for fixing the semiconductor laser 1 to a predetermined position; and a cap 4 for covering the semiconductor laser 1 fixed to the fixed plate 3.

The fixed plate 3 has a disk-like shape and is made of a metal such as Fe, Cu, or the like. A heat sink 5 is provided on one principal plane of the fixed plate 3. The heat sink 5 is made of a material having electrical conductivity such as Fe, Cu, or the like. A surface of the heat sink 5 is coated with, for example, Au. A submount 6 is adhered onto the heat sink 5. The submount 6 is made of Si or AlN. Further, the semiconductor laser 1 is adhered onto the submount 6. The semiconductor laser 1 is a III-group nitride semiconductor laser, for example, a GaN/GaInN system semiconductor laser, more specifically, a GaN/GaInN system semiconductor laser of a band of 405 nm.

Three lead pins 7a, 7b, and 7c are provided for the fixed plate 3 so as to penetrate the fixed plate 3. The lead pin 7a is electrically connected to the heat sink 5. The lead pin 7b is connected to the submount 6 by a wire 8. The wire 8 is made of, for example, an electrically conductive material such as Au. Spacers made of glass of a low melting point are provided between the lead pins 7b and 7c and the fixed plate 3. Thus, the lead pins 7b and 7c and the fixed plate 3 are insulated and it is possible to prevent the atmosphere from entering the CAN package 2. Each of the lead pins 7a, 7b, and 7c is made of, for example, a material having electrical conductivity such as Fe, Cu, or the like.

The cap 4 has a cylindrical shape in which one opening is closed and is made of, for example, a metal such as Fe or the like. A surface of the cap 4 is plated with, for example, Cr. The fixed plate 3 mentioned above is adhered onto the opening side of the cap 4 and a light extracting portion 9 to extract the laser beam emitted from the semiconductor laser 1 is provided on the side opposite to the opening side. The light extracting portion 9 has a circular shape and is covered with sealing glass 10 made of glass comprising fused quartz of high transmittance as a base material. It is preferable that the sealing glass 10 is coated with a nonreflective layer.

An assembling method of the CAN package light emitting device according to the first embodiment of the invention will now be described with reference to FIGS. 2A, 2B, 3A, 3B, 4A, and 4B.

<Chip Mounting Step>

First, as shown in FIG. 2A, the semiconductor laser 1 is adhered to a predetermined position on the submount 6 by an adhesive agent. For example, a solder of Sn, SnPb, AuSn, In, or the like is used as an adhesive agent.

<Die-bonding Step>

Figure 2B:
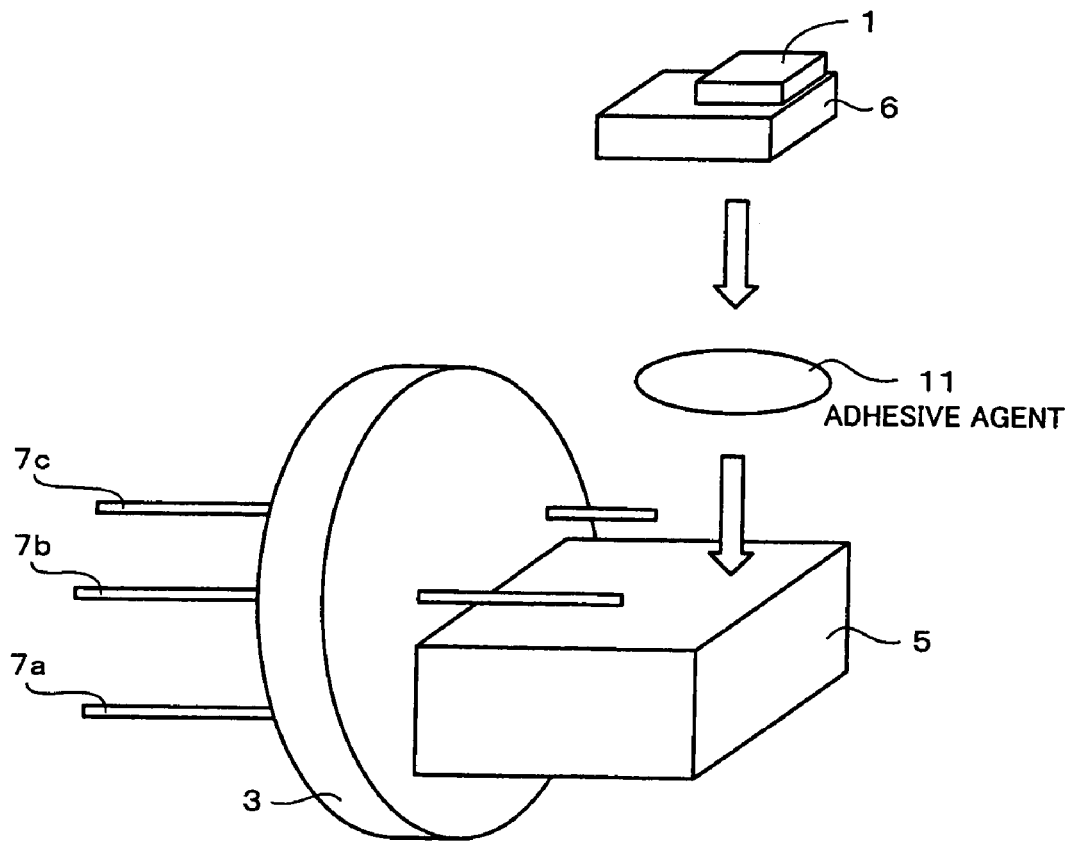

Subsequently, as shown in FIG. 2B, the submount 6 is adhered to a predetermined position on the heat sink 5 by an adhesive agent 11. An Ag paste is used as an adhesive agent 11 here. The adhesive agent 11 is not limited to the Ag paste but a solder of In or the like can be used. By using the solder as an adhesive agent, an amount of Si organic compound gas which is generated from the adhesive agent in the CAN package 2 obtained after the sealing can be further reduced. Thus, the creation of the deposit in the light emitting portion of the semiconductor laser 1 can be further prevented.

<Paste Hardening Step>

Figure 3A:
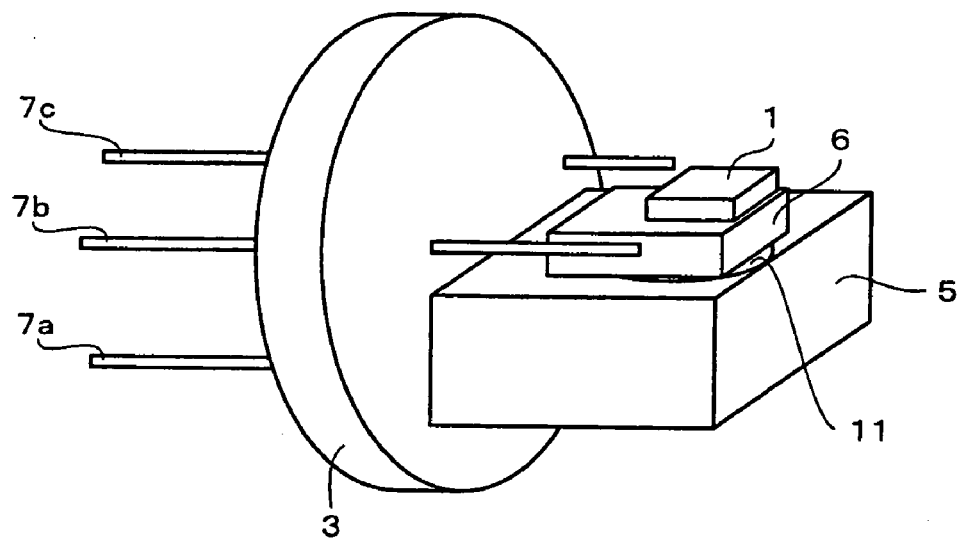
FIGS. 3A and 3B are schematic diagrams showing the example of the assembling method of the CAN package light emitting device according to the first embodiment of the invention.

Subsequently, as shown in FIG. 3A, the adhesive agent 11 is hardened.

<Wire-bonding Step>

Figure 3B:
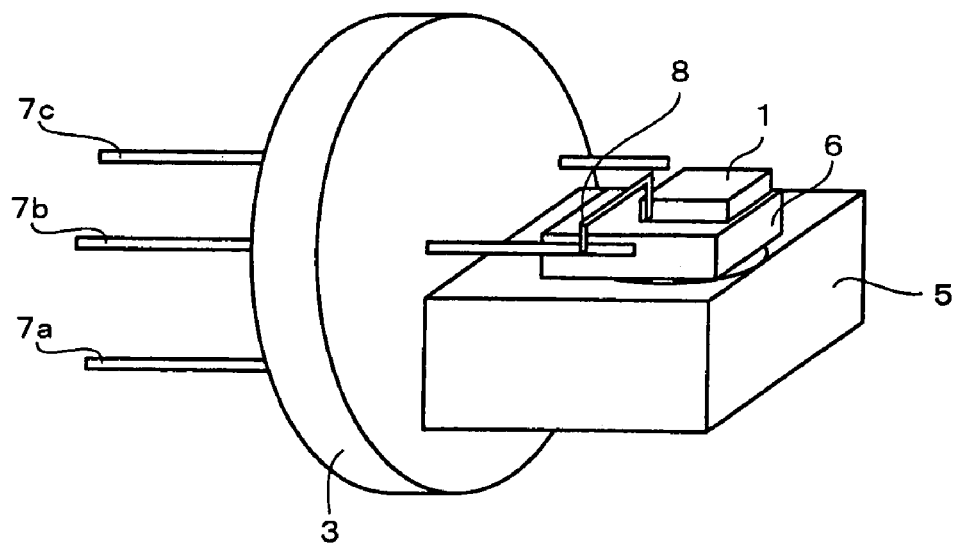

Subsequently, as shown in FIG. 3B, the submount 6 and the lead pin 7b are connected by the wire 8.

<Sealing Step>

Figure 4A:
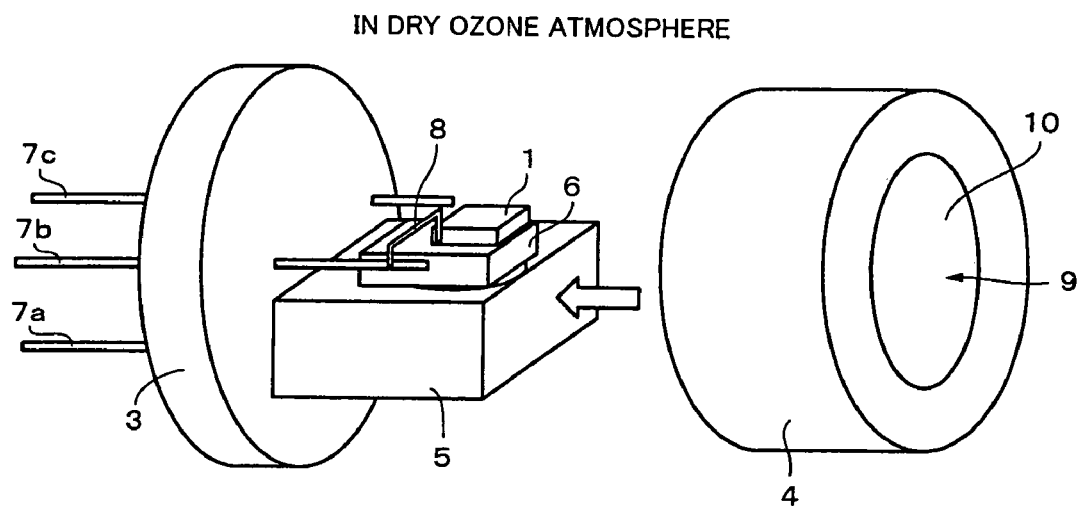
FIGS. 4A and 4B are schematic diagrams showing the example of the assembling method of the CAN package light emitting device according to the first embodiment of the invention.

Subsequently, as shown in FIG. 4A, the cap 4 is adhered to the fixed plate 3 by, for example, the electrical welding in an ozone (dry ozone) atmosphere from which moisture ($H_2O$) has been removed. The sealing glass 10 has previously been adhered to the light extracting portion 9 of the cap 4. For example, the glass of a low melting point is used for adhering the sealing glass 10.

<Ozone Cleaning Step>

Figure 4B:
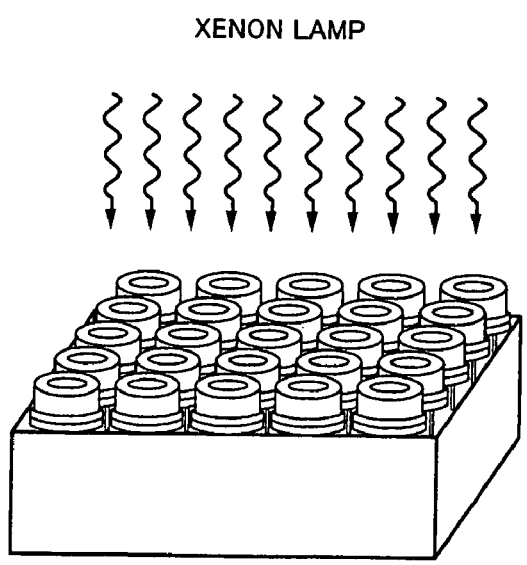

Subsequently, as shown in FIG. 4B, light having a wavelength of 400 nm or less, for example, ultraviolet rays are irradiated into the CAN package light emitting device through the light extracting portion 9. Thus, it is possible to prevent the Si organic compound gas from existing in the CAN package light emitting device or to suppress its concentration to a level which does not cause any practical problem. For example, a xenon lamp is used as a light source.

An amount of contamination sources containing the Si organic compound depends largely on a material which is set into the CAN package 2, a working environment, and the like. An out-gas molecular weight changes in proportion to a volume of CAN package 2. Such a phenomenon is derived from the Boyle-Charles' rule because a saturated vapor pressure does not depend on a volume. Therefore, it is preferable to properly select irradiating conditions in accordance with the installing parts and a package size.

An example of the irradiating conditions are mentioned here. Assuming that a diameter of the CAN package 2 is equal to 5.6 mm and the irradiation light is the ultraviolet rays, illuminance of the irradiation light is selected to be 3.6 $mW/cm^2$ and an irradiating time is selected to be 5 minutes or more, preferably, 15 minutes or more. Naturally, the invention is not limited to those irradiating conditions.

By irradiating the light having the wavelength of 400 nm or less into the CAN package 2 as mentioned above, activated ozone is produced and collides with the Si organic compound. The Si organic compound is decomposed and becomes $SiO_2$ which is stabilized, that is, which is hard to be vaporized. Since stabilized $SiO_2$ is inherently non-coupled molecules of the Si organic compound adhered into the CAN package 2 and the Si organic compound contained in the adhesive agent of the Ag paste or the like, they are changed to $SiO_2$ in this position. Therefore, such a situation that stabilized $SiO_2$ is changed to the out-gas and reaches the position of the light emitting portion of the semiconductor laser 1 does not occur. A substance of the hydro carbon system is changed to CO, $CO_2$, and $H_2O$ and becomes a substance which does not cause deterioration in characteristics of the semiconductor laser 1. Thus, the creation of the deposit on the edge surface of the semiconductor laser 1 can be prevented and the deterioration in characteristics of the semiconductor laser 1 can be prevented.

According to the first embodiment of the invention, the following effects can be obtained.

Since the CAN package 2 is sealed in the dry ozone atmosphere and the light having the wavelength of 400 nm or less is irradiated into the sealed CAN package 2 through the light extracting portion 9, the vaporization of the Si organic compound existing in the CAN package 2 can be prevented without providing the time-dependent and environmental limitations in the steps. Thus, the creation of the deposit in the light emitting portion of the semiconductor laser 1 can be prevented without causing the deterioration in mass-productivity. The material handling can be simplified and the mass-productivity can be improved.

Since the light having the wavelength of 400 nm or less is irradiated into the CAN package 2 through the light extracting portion 9 provided for the cap 4, it is unnecessary that a dedicated window for the ozone cleaning is provided for the CAN package 2. Therefore, the structure of the CAN package light emitting device can be simplified and the costs of the parts can be reduced.

The inventors of the present invention have compared and examined the CAN package light emitting device according to the first embodiment of the invention and the conventional CAN package light emitting device. The conventional CAN package light emitting device has been manufactured by the foregoing assembling method from which the ozone cleaning step is omitted.

Figure 5A:
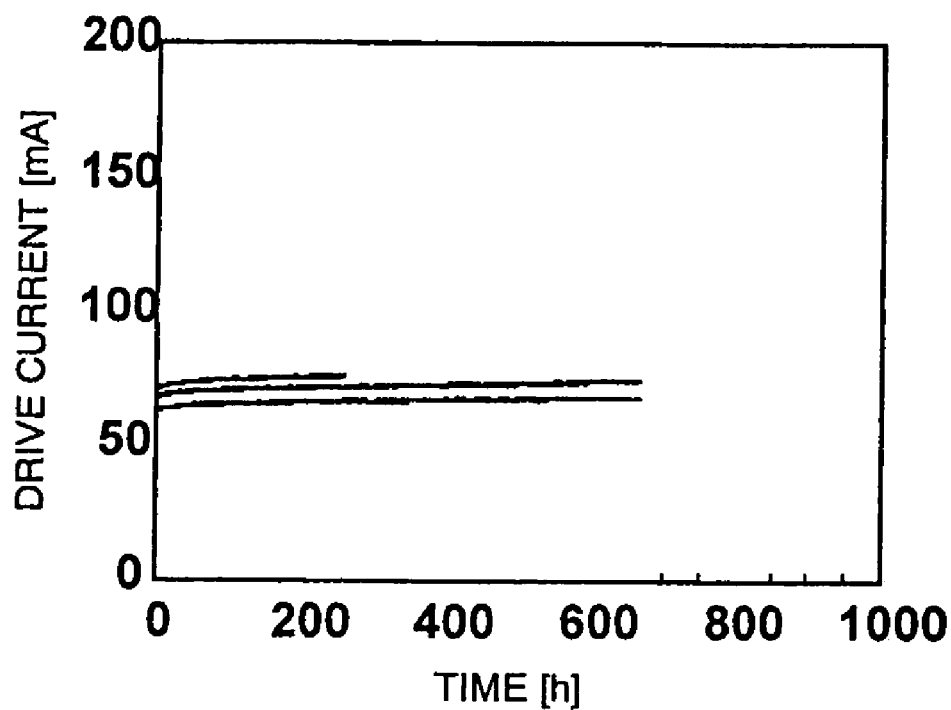
FIGS. 5A and 5B are graphs showing results of drive current fluctuation tests of the CAN package light emitting devices in the first embodiment of the invention and a prior art.
Figure 5B:
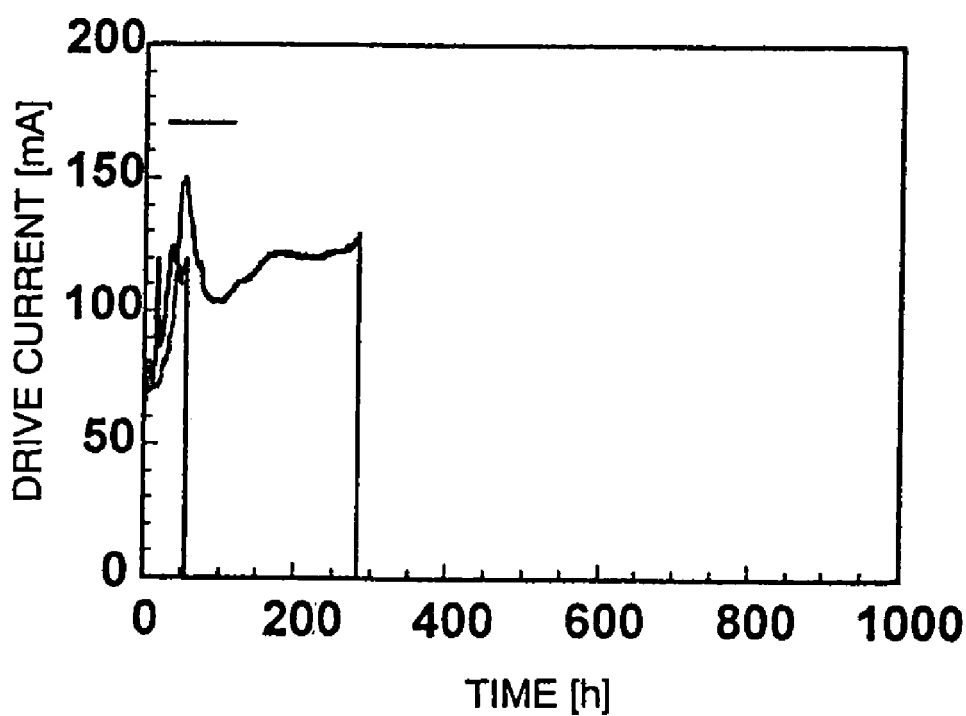

First, the inventors of the present invention performed a drive current fluctuation test (APC aging) under conditions of a detection output of 30 mW and a temperature of 60° C. FIG. 5A shows a result of the drive current fluctuation test in the CAN package light emitting device according to the first embodiment. FIG. 5B shows a result of the drive current fluctuation test in the conventional CAN package light emitting device. It will be understood from FIGS. 5A and 5B that although the drive current fluctuates in association with the elapse of time in the conventional CAN package light emitting device, the drive current does not fluctuate in association with the elapse of time in the CAN package light emitting device according to the first embodiment but is constant.

Subsequently, the inventors of the present invention observed the edge surface of the semiconductor laser by an SEM (Scanning Electron Microscope) with respect to each light emitting device after completion of the drive current test.

Figure 6A:
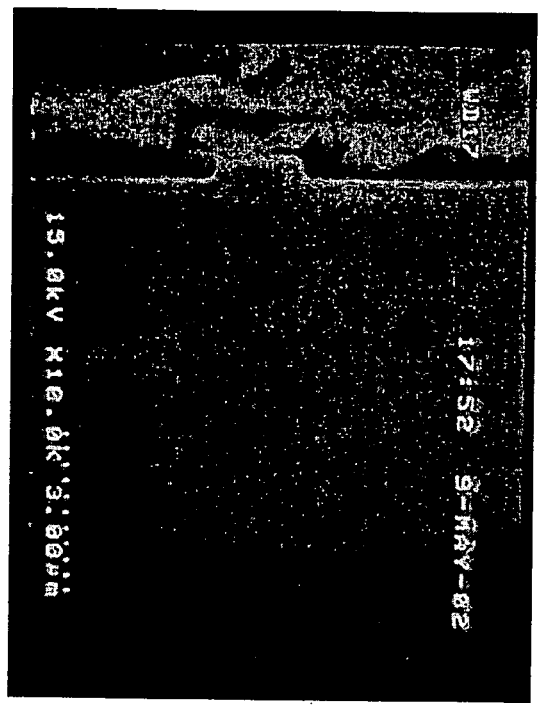
FIGS. 6A and 6B show SEM images at edge surfaces of semiconductor lasers provided for the CAN package light emitting devicees in the first embodiment of the invention and the prior art.
Figure 6B:
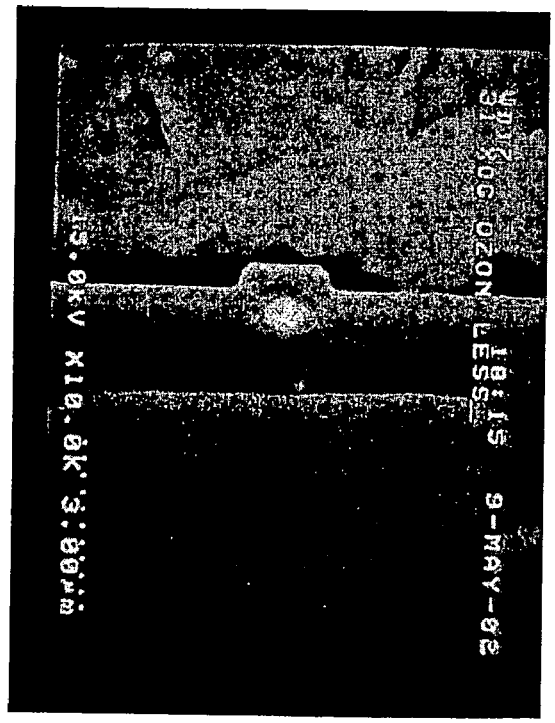

FIG. 6A shows a SEM image of the light emitting portion of the CAN package light emitting device in the first embodiment. FIG. 6B shows a SEM image of the light emitting portion of the conventional CAN package light emitting device. It will be understood from FIGS. 6A and 6B that although the deposit has been formed in the light emitting portion of the conventional CAN package light emitting device, no deposit is formed in the light emitting portion of the CAN package light emitting device according to the first embodiment.

Subsequently, compositions of the deposit formed in the light emitting portion of the conventional CAN package light emitting device were analyzed. The analysis showed that the deposit is a substance comprising Si and O as main components and has a refractive index different from that of the atmosphere. Therefore, a reflectance on the edge surface of the semiconductor laser fluctuates in dependence on a thickness of deposit.

A periodic fluctuation of a threshold current value of the semiconductor laser can be qualitatively shown by the following relational expression.

threshold gain=internal loss+1/(2×length of resonator)×$Ln$[1/(reflectance of front edge surface× reflectance of rear edge surface)

A flat package light emitting device according to the second embodiment of the invention will now be described. An example of a construction of a flat package light emitting device according to the second embodiment of the invention is shown in FIG. 7. As shown in FIG. 7, this light emitting device comprises: a photodiode IC (Photo Diode Integrated Circuit) 21; and a flat package 22 for enclosing the photodiode IC 21. A semiconductor laser 25, a multiprism 26, and photodetectors (photodiodes) 27a and 27b are mainly mounted on the photodiode IC 21.

The semiconductor laser 25 is a III-group nitride semiconductor laser, for example, the GaN/GaInN system semiconductor laser, more specifically, the GaN/GaInN system semiconductor laser of the band of 450 nm. The multiprism 26 guides the laser beam reflected by, for example, an optical disc to the photodetectors 27a and 27b. The photodetectors 27a and 27b receive the laser beams guided by the multiprism 26 and output electric signals according to the received laser beams.

The flat package 22 comprises: an enclosing portion 23 for enclosing the photodiode IC 21; and sealing glass 24 which is stuck to the enclosing portion 23. The enclosing portion 23 has a space for enclosing the photodiode IC 21. The sealing glass 24 is made of quartz having high transmittance. It is preferable that the sealing glass 24 is coated with a nonreflective layer.

An assembling method of the flat package light emitting device according to the second embodiment of the invention will now be described with reference to FIGS. 8A to 8C, 9A, and 9B.

<Chip Mounting Step>

Figure 8A:
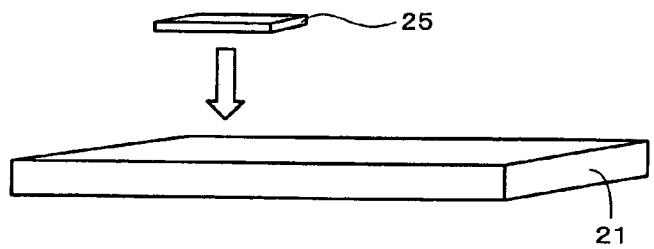
FIGS. 8A to 8C are schematic diagrams showing an example of an assembling method of the flat package light emitting device according to the second embodiment of the invention.

First, as shown in FIG. 8A, the semiconductor laser 25 is adhered to a predetermined position on the photodiode IC 21 by using a solder as an adhesive agent. For example, a solder of In or the like is used here as a solder. Although not shown or described here, in a previous step to the chip mounting step, the photodetectors 27a and 27b are previously mounted on the photodiode IC 21.

<Prism Mounting Step>

Figure 8B:
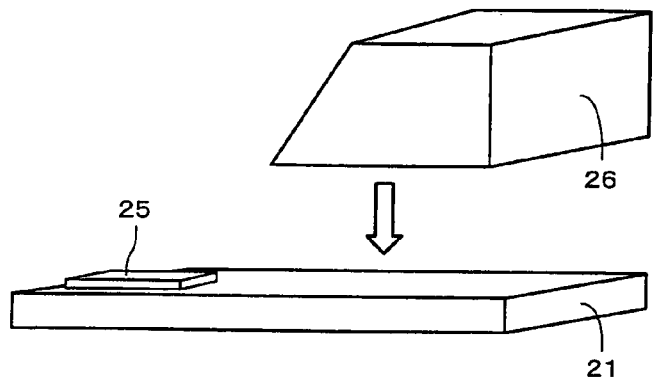

Subsequently, as shown in FIG. 8B, the multiprism 26 is mounted to a predetermined position on the photodiode IC 21 by using a solder as an adhesive agent. It is preferable here to use a solder whose melting point is lower than that of the solder used in the foregoing chip mounting step as a solder. A denaturated acrylate of an ultraviolet hardening type can be used as an adhesive agent.

<Die-bonding Step>

Figure 8C:
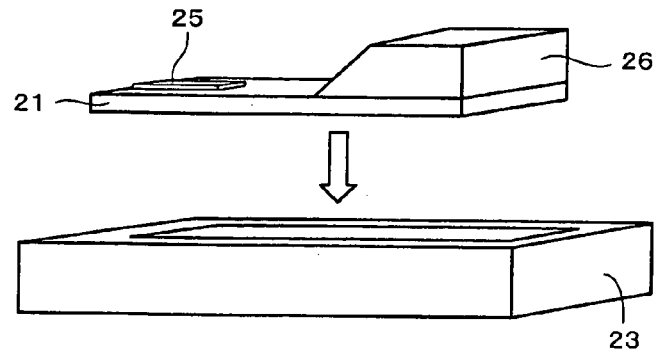

Subsequently, as shown in FIG. 8C, the photodiode IC 21 is adhered to the enclosing portion 23 by using a solder as an adhesive agent. It is preferable here to use a solder whose melting point is lower than that of the solder used in the foregoing prism mounting step as a solder. An epoxy adhesive agent can be used as an adhesive agent.

<Sealing Step>

Figure 9A:
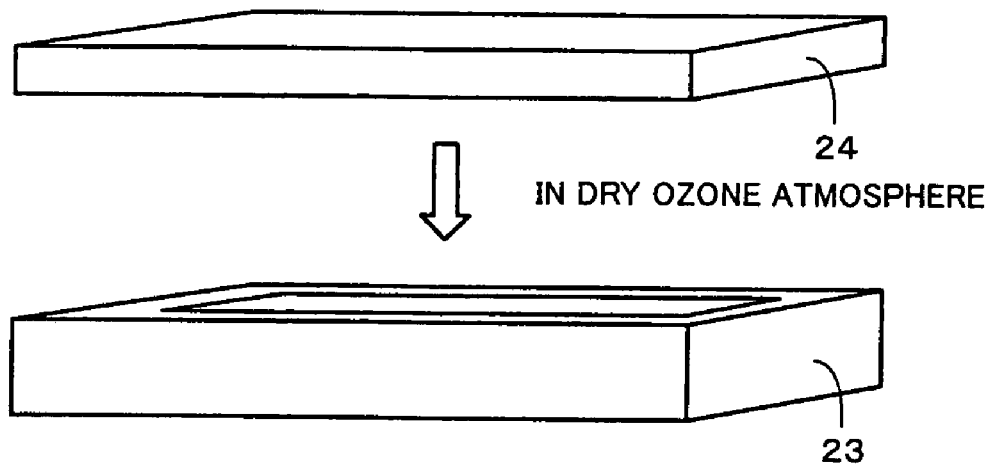
FIGS. 9A and 9B are schematic diagrams showing an example of the assembling method of the flat package light emitting device according to the second embodiment of the invention.

Subsequently, as shown in FIG. 9A, the sealing glass 24 is stuck to the enclosing portion 23 by using a solder as an adhesive agent in the ozone (dry ozone) atmosphere from which moisture ($H_2O$) has been removed. Thus, the sealed flat package 22 is formed. In this case, it is preferable to previously pattern a metal to an adhering portion of the sealing glass 24. It is also desirable here that a solder whose melting point is lower than that of the solder used in the foregoing die-bonding step is used as a solder. An epoxy adhesive agent of a thermosetting type can be used as an adhesive agent.

<Ozone Cleaning Step>

Figure 9B:
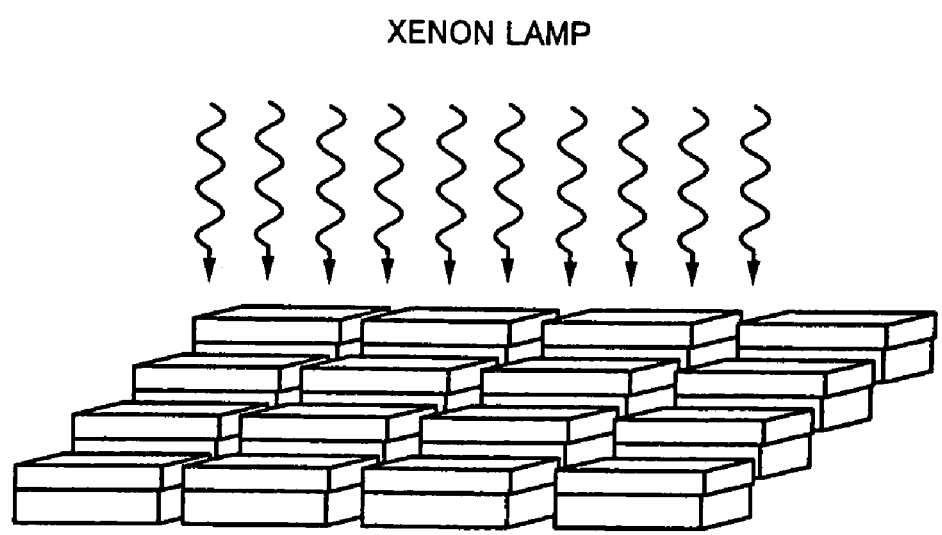
Figure 10A:
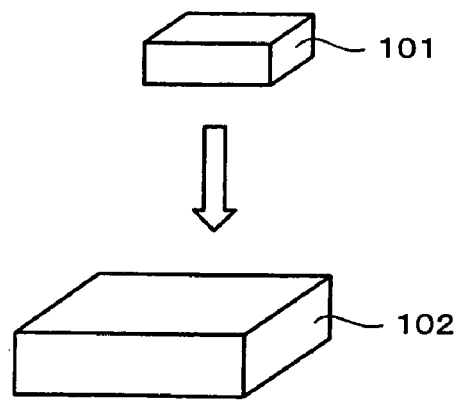
FIGS. 10A and 10B are schematic diagrams for explaining the assembling method of the conventional CAN package light emitting device.
Figure 10B:
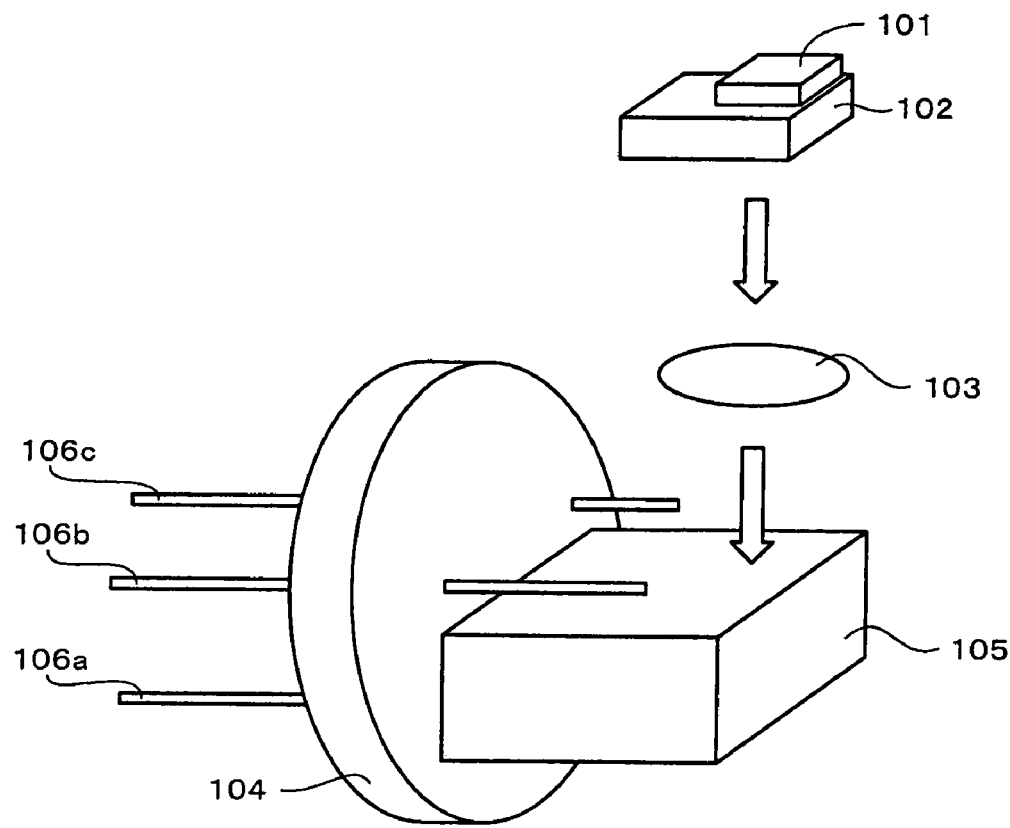
Figure 11A:
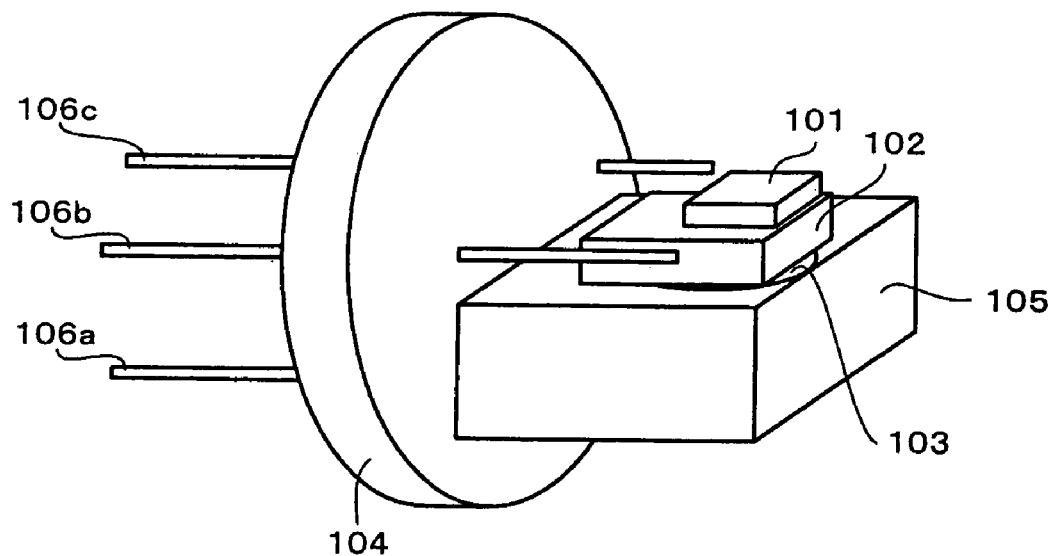
FIGS. 11A and 11B are schematic diagrams for explaining the assembling method of the conventional CAN package light emitting device.
Figure 11B:
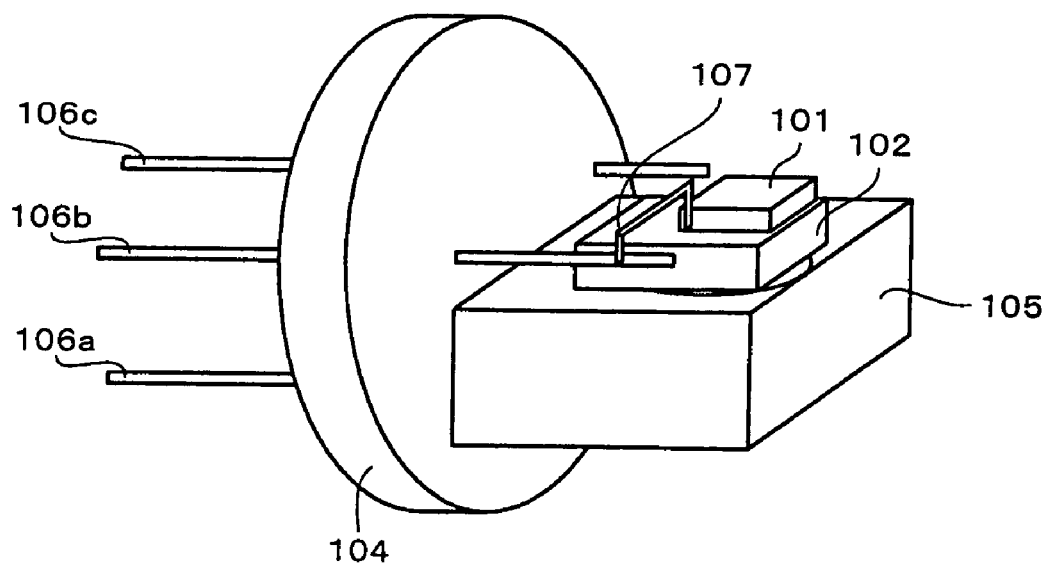
Figure 12A:
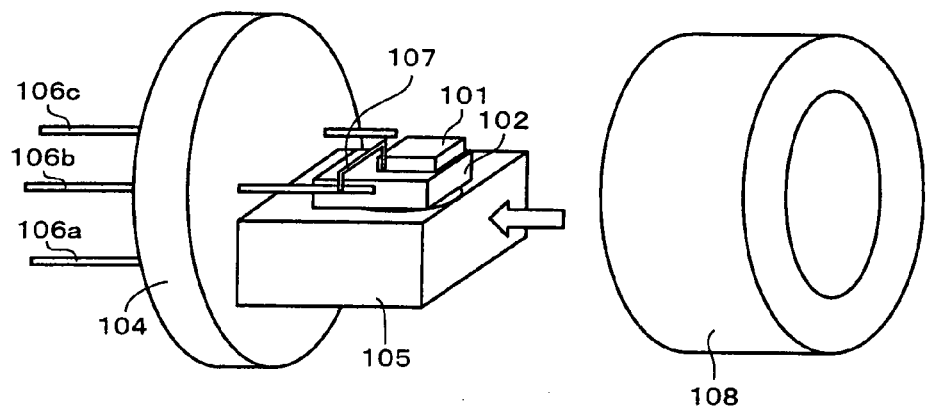
FIGS. 12A and 12B are schematic diagrams for explaining the assembling method of the conventional CAN package light emitting device.
Figure 12B:
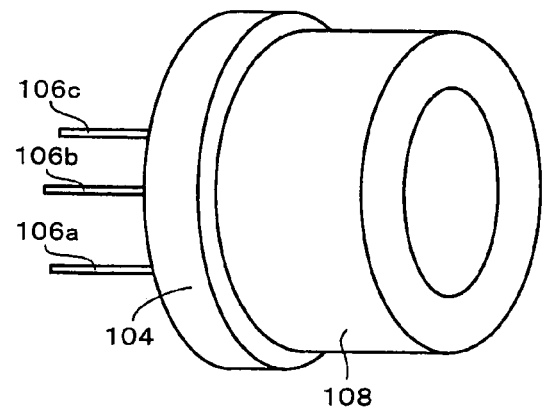

Subsequently, as shown in FIG. 9B, light having a wavelength of 400 nm or less, for example, ultraviolet rays are irradiated into the flat package light emitting device through the sealing glass 24. Thus, it is possible to control so that no Si organic compound gas exists in the flat package light emitting device or suppress the Si organic compound gas concentration to a level that causes no practical problems. For example, a xenon lamp is used as a light source.

According to the second embodiment of the invention, effects similar to those in the above first embodiment can be obtained.

Although the embodiments of the invention have specifically been described above, the invention is not limited to the first and second embodiments but various modifications based on technical ideas of the invention are possible.

For example, the numerical values mentioned in the above embodiments are shown as examples and numerical values different from such values can be used as necessary.

A shape of the package is not limited to the CAN package in the first embodiment and the flat package in the second embodiment. Naturally, the invention can be also applied to the packages having other shapes. Parts which are enclosed in the package are not limited to those in the examples of the foregoing embodiments.

Although the second embodiment has been shown with respect to the example in which the invention is applied to the integrated optical device, a form of the integration is not limited to it.

In the foregoing first and second embodiments, the case where in the ozone cleaning step, the light having the wavelength of 400 nm or less is irradiated into the package through the light extracting portion 9 or the sealing glass 24 has been shown as an example. However, separately from the light extracting portion 9 or the sealing glass 24, a dedicated window for irradiating the illumination light into the package can be also provided. In the case of considering the simplification of the structure of the light emitting device and the reduction in costs of the parts, it is desirable to irradiate the illumination light into the package in a manner similar to the cases of the first and second embodiments mentioned above.

In the first and second embodiments mentioned above, it is preferable that a member which generates the Si organic compound gas is not enclosed in the package. As an adhesive agent as well, it is desirable to use such an agent containing no Si organic compound.

In the first and second embodiments mentioned above, in the case of using the parts which generate the Si organic compound gases and the adhesive agent, it is desirable to shorten the time which is required from the sealing step to the ozone cleaning step. It is also desirable to set a preserving temperature to a value around the room temperature.

In the first and second embodiments mentioned above, the example in which the light having the wavelength of 400 nm or less is irradiated in the ozone cleaning step has been shown. However, as such a light source, the light source which has conventionally been used in the manufacturing step of the semiconductor laser or a LED (Light Emitting Diode), or the like can be also used.

For example, the step of irradiating the light having the wavelength of 400 nm or less has widely been used in the manufacturing step of the semiconductor laser of the AlGaAs system, AlGaInP system, AlGaInAs system, or the like which has already been put into practical use or the light emitting element of the LED. Specifically speaking, such a light irradiating step has been used in the step of forming a mask pattern by using the technique of photolithography. According to this step, a wafer is coated with a photoresist having photosensitivity by using a spin coater or the like, what is called a photomask constructed by coating glass with a metal is arranged in the vicinity of or in contact with the photoresist, and the ultraviolet rays are irradiated, thereby photosensing the photoresist.

At the research and development level, such a light irradiating step is used in the step of activating carriers after the crystal growth or in the step of crystallization recovery or alteration, and further in the step of irradiating the ultraviolet rays during the crystal growth, for example, like an optical CVD (Chemical Vapor Deposition).

However, in the manufacturing step of the semiconductor laser or the LED, or the like, such a light irradiating step is used in the step at the stage before what is called the creation of a laser structure, a LED structure, or the like is completed, that is, in the step during the crystal growth, after the growth, or at the time of processing of a wiring pattern. According to the invention, it is used in the installing step as mentioned above.

In the first and second embodiments mentioned above, when the illumination light is not irradiated to all of the devices in the package light emitting device, it is preferable to prolong the irradiating time or to raise the irradiating intensity. Thus, it is possible to enable ozone in the portion to which the illumination light has been irradiated to enter the portion to which the illumination light was not irradiated.

As described above, according to the invention, the vaporization of the Si organic compound existing in the package can be prevented without providing the time-dependent and environmental limitations in the steps. Thus, the creation of the deposit in the light emitting portion of the light emitting element can be prevented without deteriorating the mass-productivity.

The invention claimed is:

1. An assembling method of a light emitting device having a light emitting element for emitting light and a package for enclosing and sealing at least said light emitting element, said method comprising the steps of:
    sealing said light emitting element within said package while in an ozone atmosphere, and
    irradiating light having a wavelength of 400 nm or less into said sealed package.

2. An assembling method of the light emitting device according to claim 1, wherein at least a part of said package comprises a transparent or semi-transparent light extracting portion for extracting the light emitted from said light emitting element, and said irradiating light is irradiated into said sealed package through said light extracting portion.

3. An assembling method of the light emitting device according to claim 2, wherein said light extracting portion with comprises glass in which quartz is used as a base material.

4. An assembling method of the light emitting device according to claim 1, wherein said light emitting element is a III-group nitride semiconductor.

5. An assembling method of the light emitting device according to claim 1, wherein said irradiating light is generated via a xenon lamp source.

6. An assembling method of the light emitting device according to claim 1, wherein said irradiating light is generated via a light source having a substantial output in the blue to ultraviolet range.

7. An assembling method of the light emitting device according to claim 1, wherein said irradiating step suppresses a Si organic gas compound within the package.

8. An assembling method of the light emitting device according to claim 1, wherein said irradiating step eliminates a Si organic gas compound within the package.

* * * * *